(12) United States Patent
Confalonieri et al.

(10) Patent No.: US 8,250,282 B2
(45) Date of Patent: Aug. 21, 2012

(54) PCM MEMORIES FOR STORAGE BUS INTERFACES

(75) Inventors: Emanuele Confalonieri, Milan (IT);
Manuela Scognamiglio, Milan (IT);
Federico Tiziani, Milan (IT)

(73) Assignee: Micron Technology, Inc., Boise, ID (US)

( * ) Notice: Subject to any disclaimer, the term of this patent is extended or adjusted under 35 U.S.C. 154(b) by 397 days.

(21) Appl. No.: 12/466,366

(22) Filed: May 14, 2009

(65) Prior Publication Data

US 2010/0293317 A1 Nov. 18, 2010

(51) Int. Cl.
*G06F 13/00* (2006.01)
(52) U.S. Cl. ........ 711/100; 711/101; 711/102; 711/103; 711/104; 711/114
(58) Field of Classification Search .................. 711/100, 711/101, 102, 103, 104, 114
See application file for complete search history.

(56) References Cited

U.S. PATENT DOCUMENTS

| | | | | |
|---|---|---|---|---|
| 7,287,118 | B2 * | 10/2007 | Chang et al. | 711/103 |
| 7,552,272 | B2 * | 6/2009 | Gonzalez et al. | 711/103 |
| 7,596,656 | B2 * | 9/2009 | Elhamias | 711/103 |
| 7,620,769 | B2 * | 11/2009 | Lee et al. | 711/103 |
| 7,856,522 | B2 * | 12/2010 | Lee et al. | 711/103 |
| 7,934,055 | B2 * | 4/2011 | Flynn et al. | 711/114 |
| 7,966,462 | B2 * | 6/2011 | Lee et al. | 711/103 |

* cited by examiner

*Primary Examiner* — Trong Phan
(74) *Attorney, Agent, or Firm* — Schwegman, Lundberg & Woessner, P.A.

(57) ABSTRACT

A memory controller for a phase change memory (PCM) that can be used on a storage bus interface is described. In one example, the memory controller includes an external bus interface coupled to an external bus to communicate read and write instructions with an external device, a memory array interface coupled to a memory array to perform reads and writes on a memory array, and an overwrite module to write a desired value to a desired address of the memory array.

17 Claims, 4 Drawing Sheets

PCM MEMORIES FOR STORAGE BUS INTERFACES

BACKGROUND

A wide range of portable electronic devices including cameras, telephones, game machines, navigation systems, web devices, personal data assistants, digital picture frames, music and video players, etc. use non-volatile memory coupled to a processor through a standardized interface. This approach has also been adopted for some larger embedded systems, such as home entertainment devices, appliances, home and office automation and surveillance systems, and controllers for motors, factory processes, etc. Commonly, the memory is an internal NAND (Not AND) flash memory, but in other cases it is a removable memory card, and in some cases both are used.

Extensive development efforts have greatly improved the cost, reliability, speed and density of flash memory, however, writing to flash is still slow and complicated when compared to most types of random access memory (RAM). In a typical application, the flash memory includes a controller circuit that uses RAM to temporarily store values while the controller performs the complex sequence of operations needed to write to the flash memory. The controller is sometimes referred to as a "Store and Download" or "Page Demanding" system, rather than "Execution in Place".

Phase-change memory (PCM) has recently been touted as a possible successor to many different types of RAM. It offers true random access, reasonable write speeds, very high read speeds, low power consumption and is non-volatile. While using PCM instead of RAM in the memory controller offers some advantages in a flash memory system, the write speeds and complexity of flash management are not improved.

Currently the most common interface for both embedded and external flash memory is MultiMediaCard (MMC) and the corresponding embedded MMC (eMMC). These are used with CompactFlash, secure digital (SD), mini and micro SD, and MMC cards, etc. eMMC standards allow a single interface to be used with embedded or internal flash memories, removable cards, and even hard disk drives. New standards such as Universal Flash Storage (UFS) also are being developed to allow internal and external flash memory to share a single bus.

In order to simplify the MMC/eMMC interface, the memory controller adapts the NAND interface to the MMC bus interface and also manages tasks specific to NAND technology, such as bad blocks management, error correction and detection, wear leveling algorithms, safe management, and logical to physical block remapping. This reduces the complexity of the rest of the system, but these additional memory controller tasks further slow write and read operations.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
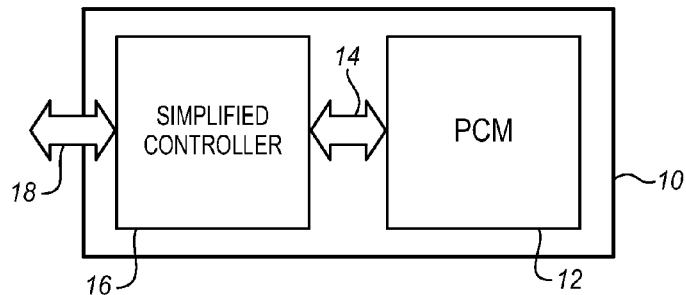
FIG. 1A shows a block diagram of a managed PCM product with a memory array and a controller in a single package in accordance with an embodiment.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

PCM can be adapted to replace the flash memory in embedded and external flash card systems, however, without modifying the controller circuit for the memory array, the write speed will not be significantly increased. With changes to the controller circuit and its interaction with the storage bus interface, however, a significant operational improvement can be obtained.

Phase-Change-Memory technology provides many advantages over NAND and NOR (Not Or) flash technology. It is more reliable, has higher endurance, and is intrinsically faster to read and write than NAND. In addition, PCM does not need complex data management algorithms to increase the memory's reliability or extend its lifetime. That is because the lifetime for a PCM cell is much greater than for a flash cell. By modifying the tasks of the controller circuit for the unique advantages of PCM, the overall access time of a PCM system can be greatly improved as compared to a flash memory system.

Another significant advantage of PCM is bit alterability. In PCM it is possible to write a "0" over a "1" as well to write a "1" over a "0". It is also possible to do this at any time for any one cell in the array. The individual accessibility of each cell may depend, however, on how the array is configured. In flash, a group of cells, typically a block, must first be erased setting all of the cells to the same value, typically "1". Then it is only possible to program or write the opposite value typically "0", or to leave the cell unaltered. The cells are written on a page basis. Many pages make up a block.

Bit alterability allows for unique operations that cannot be performed with a flash memory cell array. These operations can be incorporated into the design of a controller circuit for an array of PCM memory cells. One such unique operation is overwriting.

An "overwrite" writes either a "1" or a "0" to any cell regardless of the original state of the cell. An overwrite allows for an in-place update and simplifies any need for garbage collection and logical to physical block remapping tasks. In a flash memory, after all the cells in a block are erased, they all have the same value, typically assigned as "1." The cells can then be programmed to zero or for multi-level cells, to any two-bit value. By programming some cells, but not others, any array of values can be set. After having once programmed a cell, it cannot be altered until after another erase cycle. Overwriting is therefore never possible, only programming.

The parameters for an overwrite command are simply the address of the cell to be written and the value to be written. A set of parameters can be combined to write a complete word of eight, sixteen, twenty, sixty-four or some other size to a specific group of cells in the array. Depending on the memory array interface, an entire word or several words can be written in a single clock cycle. Any cells in the array can be selected and this can be tracked, for example, using a logical to physical memory map or remap table.

Another unique operation is writing any desired range of cells to the same value. "Write range to all 1" is an operation that writes all of the cells within an address range to "1" or alternatively "Write range to all 0" can write all of the cells to "0." The size of the address range can be selected to any desired criteria. Therefore it can be used as an erase operation that can be applied to any region of the memory cell. The size and allocation need not be predefined as with a block in flash memory. The address range can be large or small and can start and end wherever desired. The parameters for a write range to all 1 or 0 command are simply the command and the address range to which the write operation is to be applied.

With this operation, a logical to physical block remapping task can still be used. However, since the remap tables in a PCM device can be read faster than in a NAND flash device, the logical to physical remapping has little impact on the random access performance of a PCM memory cell.

A simplified memory controller can be used with a PCM memory array that contains only these functions, a logical to physical address table, and two interfaces, one to the memory and the other to an external bus. The memory controller is simpler, having fewer functions to implement and for the same reason is also faster. The controller can also be faster because these two functions are simpler and faster than the functions typically provided on a flash memory array.

FIG. 1A shows an example of managed PCM product 10. The exterior housing can be in the form of a removable card, an integrated circuit chip, or a portion of a larger die such as a processor. The memory system 10 has a PCM memory cell array 12 coupled through a data and address bus 14 to a simplified memory controller 16. The memory controller has a storage bus interface 18 to communicate with the rest of the system or an external component. As mentioned above, this can be an internal interface for embedded devices or an external interface for removable external devices. The interface may be MMC, eMMC, UFS or any of a variety of other interfaces, however, the particular interface is not essential to the present invention.

Figure 1B:
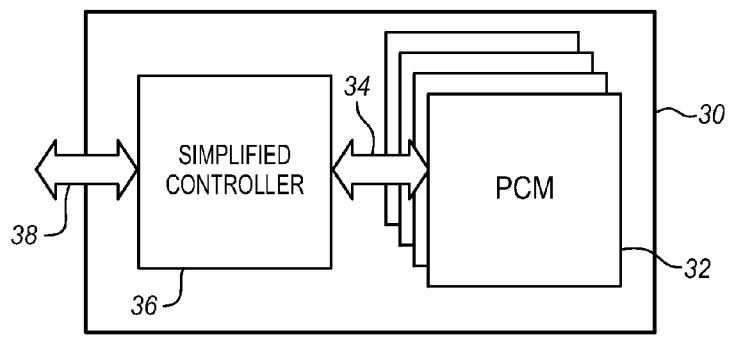
FIG. 1B shows a block diagram of a managed PCM product with a multiple block memory array and a controller in a single package in accordance with an embodiment.

FIG. 1B shows an alternative in which several PCM devices or dies 32 are contained in a single package or housing 30. The PCM devices are all connected through a data, address and control bus 34 to a single controller 36 which provides the external interface 38. In this example, the PCM devices and the controller are implemented as discrete dies, but all in one package or housing.

Figure 2:
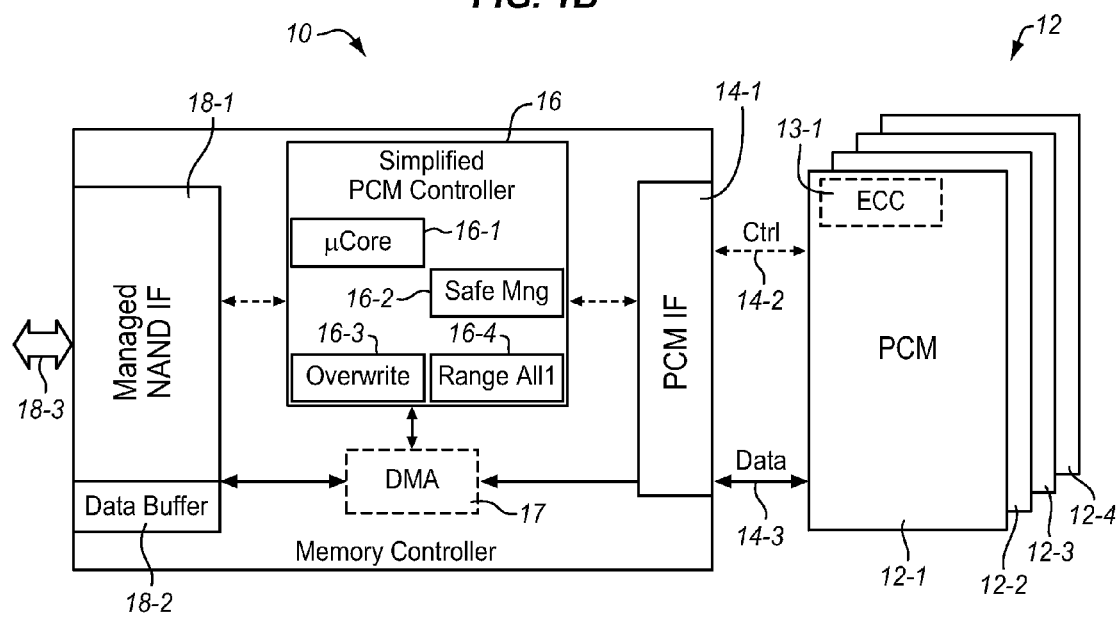
FIG. 2 shows a block diagram of the managed PCM product of FIG. 1B in more detail in accordance with an embodiment.

FIG. 2 shows the managed PCM product 10 of FIG. 1A or 1B in more detail. As mentioned with respect to FIG. 1A, the illustrated components may be part of single die or composed of several dies. The components may be contained in a single package, housing, or removable card or contained in several discrete packages. The PCM memory array 12 has 4 array blocks 12-1, 12-2, 12-3, 12-4 in the illustrated example, however, more or fewer array blocks may be used. Each array block may include an error correction codec (ECC) 13-1 (only one is shown). This codec applies error correction codes to data that is written to memory and uses those codes to correct errors when data is read from the memory.

The PCM array communicates through PCM interface 14-1 using a control bus 14-2 and a data bus 14-3 to which it is connected. This interface provides the physical layer communication with the cells of the PCM array 12. It also is connected to and provides an interface to the simplified PCM controller 16. In addition, the interface may be connected to a direct memory access (DMA) block 17. The DMA block is connected to and interfaces directly with the external interface 18. In the illustrated example, the external interface has a managed NAND interface 18-1 to communicate on an MMC, eMMC, UFS, or other NAND based memory interface. However, a different interface adapted to communicate using a different external protocol may be used instead. The external interface also includes a data buffer 18-2 and a physical bus 18-3 to connect with the external bus. The data buffer is resident with the interface to store interim values and accommodate latencies on the internal and external buses. It may be a small high speed RAM buffer, a PCM buffer or any other type of buffer.

The PCM controller is coupled to the external interface 18 on one side and the PCM interface 14 on the other side. The PCM controller in the illustrated example contains four blocks. These blocks can be implemented as hardware modules, as firmware, or as software in a generalized controller. The first block is a microcontroller core 16-1 which is the central processing and maintenance part of the controller. The second block is a safe manager 16-2, the third block is an overwrite module 16-3 and the fourth block is a RangeAll1 module 16-4.

Figure 3:
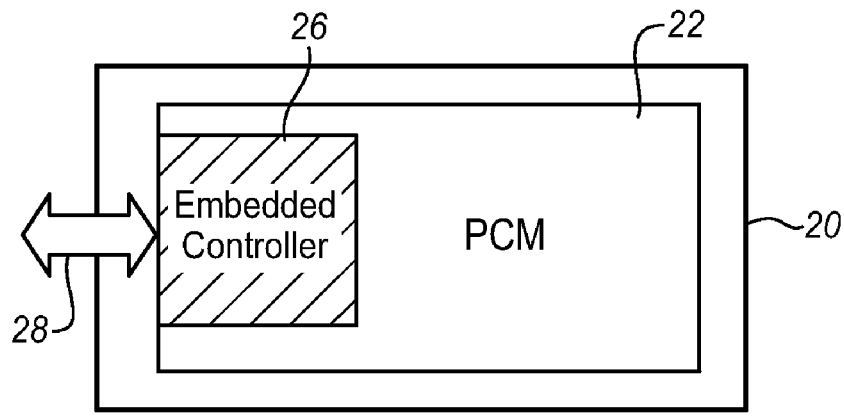
FIG. 3 shows a block diagram of a managed PCM product in which the memory array and the controller are on a single die in accordance with an embodiment.

FIG. 3 shows an alternative configuration to that of FIGS. 1A and 1B in which the memory controller is on the same die as the memory array. As in FIGS. 1A and 1B, there is an external package or container 20. A PCM memory cell array 22 is inside the package as a single die. An embedded controller 26 is constructed on the same die 22 with the memory array. The embedded controller also carries the external interface 28. The main task of the embedded controller in this configuration is to support the external bus protocol on the external interface 28. It can contain all of the functionality of the controller of FIG. 2. Due to the simplified nature of the controller, it is much easier to integrate the controller on the same die as the memory than with flash memory, for example.

Figure 4:
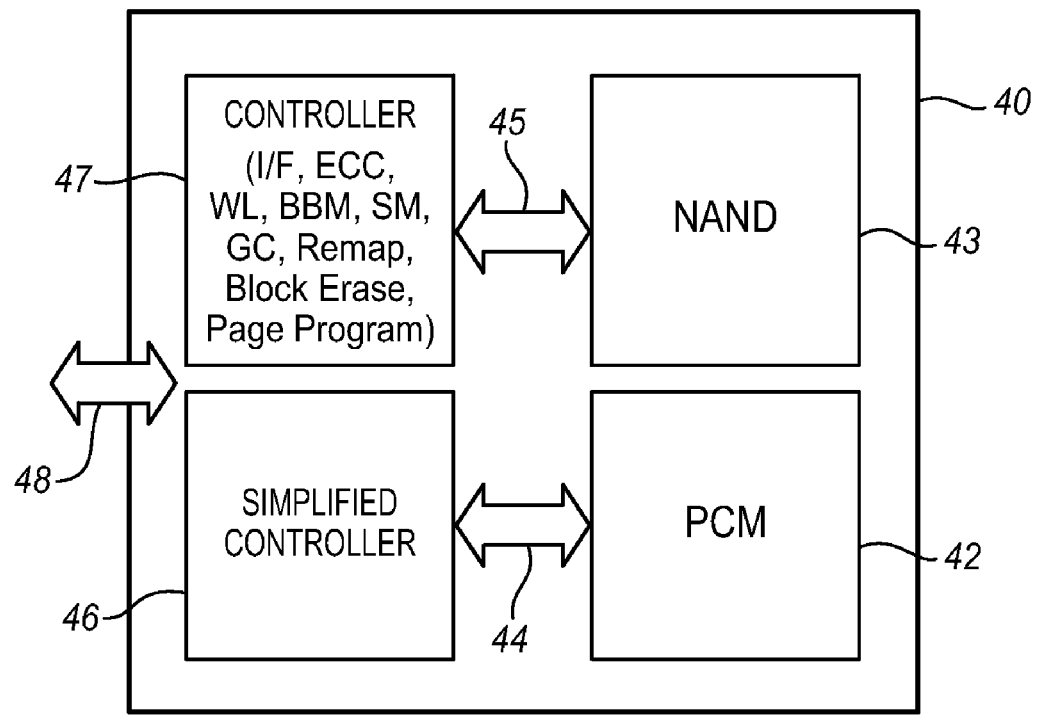
FIG. 4 a block diagram of a managed PCM product with a flash memory array and flash controller and a PCM memory and PCM controller in a single package and coupled to a single external bus in accordance with an embodiment.

FIG. 4 shows another alternative configuration using both a flash die 43 and a PCM die 42 in a single package or housing 40. Each die has its own controller. The PCM die is coupled through a bus 44 to a PCM memory controller 46, while the flash die 43 is coupled through a different memory bus 45 to a flash memory controller 47. However, the two memory controllers can both be coupled to a single external storage bus interface 48. As in the other figures, the memory controllers can be on the same or different dies from their respective memory cell arrays.

Alternatively, the two memory controllers can be combined into a single controller with different functions for the two types of memory. Shared functions can be provided to both arrays using a single module on the controller. Functions that are not shared can be dedicated to one array or the other. So, for example, the block erase module can be dedicated to the flash array while an overwrite function can be dedicated to the PCM array. Safe Management and ECC algorithms can be shared by both arrays. The entire device may be constructed as four dies, as shown or as a three, two dice.

The PCM simplified controller 46 can be similar to the controller 16 of FIG. 2. The NAND controller 47, on the other hand, is shown as a typical NAND controller and, as shown, includes hardware, firmware, or software modules for block erase, page program, ECC (Error Correction Codec), WL (Wear Leveling), BBM (Bad Block Management), SM (Safe Management), GC (Garbage Collection), and memory address remapping. These modules are typically a part of many NAND controllers and are not described here in detail.

Memory arrays are usually partitioned into two or more regions by software. In a simple example, the software partitions the memory array between code or instructions and data. These two types of information are used differently so the best memory for each type of information will handle different requirements. FIG. 4 shows an example of one way to meet these different requirements.

In one solution, MLC (Multi-Leveled Cell) NAND is used on one side for data storage and an XiP (Execute in Place) memory device such as RAM is used on the other side for code. This requires two memory interfaces and two external buses.

In another solution, a single NAND array is used with MLC (Multi-Leveled Cell) on one side and SLC (Single Level Cell) on the other side. The MLC is again used for data storage and the SLC part for code. The sizes of the pages and blocks can also be smaller for the SLC side. As with the MLC/RAM example, two different memory controllers or controller methodologies are used, but a single external interface might be able to service both flash parts.

PCM allows for an alternative as shown in FIG. 4. NAND and PCM devices are stacked in the same package together with a controller that manages both types of memory or with two controllers, one for NAND and one for PCM. Alternatively, there could be one controller for the NAND part and the PCM controller could be embedded in the PCM die. All the memory devices share the same Storage Bus Interface which allows for the same physical layer and the same link layer.

The NAND flash with its lower cost per cell, slower random write speeds, and smaller number of lifetime write cycles can be used for data, while the faster, longer lasting, but more expensive PCM can be used for code or instructions. This approach presents the speed advantages of the NAND/RAM configuration but with the simpler, smaller single storage device interface.

To support flash memory, there are many operations that are typically required in a memory controller circuit. Many of these are indicated in the flash controller 47 of FIG. 4. Many of these operations, however, are either not useful, or impossible with a PCM array. The simplest of these are the erasing and programming functions. However, there are many more functions stemming from the low total number of erases in a lifetime for flash and the requirement that flash cells be erased in large groups, not one at a time. Accordingly, these functions do not need to be included in a PCM memory controller. Removing these functions reduces the cost and power consumption of the memory controller. Some of these complex functions are described in more detail below.

Bad Block Management tracks which blocks in the flash array have become unreliable. Flash memory can only endure a limited number of erase cycles at each memory cell. As a result, cells will go bad and the number of blocks with bad cells slowly increases over time. These blocks are tracked so that they are no longer used, slowly reducing the storage capacity of the array. PCM does not suffer from a similar limit to the number of erase cycles and as a consequence the Bad Block Management algorithm is not necessary.

Wear Leveling increases the lifetime or durability of a flash memory array by spreading the usage of blocks of cells uniformly about the array. Wear Leveling tries to wear out all of the cells in the flash array evenly, rather than allowing the same block of cells to be used every time. PCM cycling capabilities are orders of magnitude greater than NAND ones. Since the cells wear out much slower there is no real need for wear leveling management.

High Order ECC (Error Correction Code) is used for flash because the memory is treated in large blocks. In addition, the memory content in flash can be corrupted due to: read disturb, program disturb and a limited number of erase cycles at each memory cell. PCM is not only more reliable but can be written and read in much smaller blocks, so even when an error correction code is used, it can be much simpler. ECC requirements might grow as new technologies reduce the size of a PCM cell. However, with PCM, the Bit Alterability allows ECC parity to be updated in place.

Garbage Collection can be made much simpler for PCM arrays. In a flash array, cells are written or programmed to a "0", but not to a "1." When cells must be changed back to a "1", a whole block must be erased and then the appropriate cells rewritten on a per page basis. Instead of doing this, the new values are written to another portion of memory and the previous portion is registered as garbage. When enough garbage has been collected, then the garbage is collected and the garbage cells are all erased.

In a PCM file system, data is written directly to memory and new data simply directly overwrites the old. No explicit erase operations are required. Files are deleted only from the file allocation table by writing the reserved file or cluster entries as non-reserved. If the file system run out of empty physical blocks, in other words if every single physical block contains only valid data and obsolete data, then in order to write new data somewhere, one or more physical blocks must be emptied so that they can be erased and reused. This process of garbage collection is far simpler than for the flash case.

Safe Management recovers data in the event of a power loss while memory cells are being written to guarantee the integrity of the data. For flash memory, if power is interrupted while one cell is being written to, then the whole block must be erased and the writing begin again from the start of a page in the block. The bit alterability of PCM simplifies the safe management.

The simplifications and reductions described above, allow for higher performance or speed, reduced cost and full compatibility with storage bus interfaces. A controller circuit and a PCM memory cell array can be fabricated on a single die and then packaged as a managed-PCM product. The product can then be contained within a removable memory card form function or embedded into a larger device.

Figure 5:
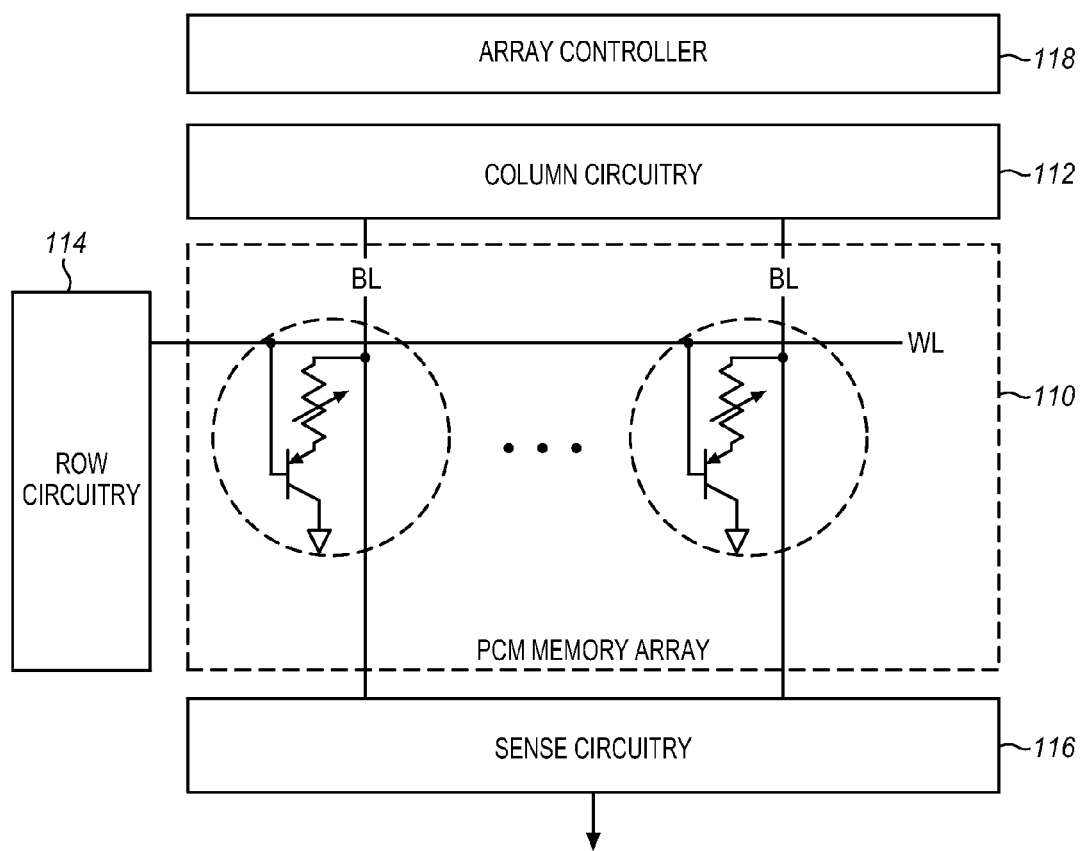
FIG. 5 is a diagram of a series of PCM memory cells in a memory cell array in accordance with an embodiment.

FIG. 5 illustrates an array of PCM cells 110 in a system memory, a nonvolatile memory in a processor core, or any other application. The array is coupled to column circuitry 112 and row circuitry 114 that allows each of the cells in the array to be accessed for read and write operations. Sense circuitry 116 is coupled to the column and row circuitry to sense values when reading and writing to a cell. An array controller 118 is coupled to the other circuitry to manage memory operations of the array.

Each memory cell in the array includes alloys of elements of group VI of the periodic table, elements such as Te or Se that are referred to as chalcogenides or chalcogenic materials. These can be combined with group IV/V elements (Ge, Sn, As, Sb). Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage.

Array 110 includes memory cells each having a selector device and a memory element. Different array architectures are possible whereas one selector device is shared among a number of cells. Although the array is illustrated with bipolar selector devices, it should be noted that alternative embodiments may use CMOS selector devices or diodes to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability.

To alter the state or phase of the memory material, that is to reach the programming regions SET and RESET, the bias is raised above the switching threshold voltage so that enough current can flow through the cell, heating up the active region and making a GST phase-change occur. An electrical current flows through the memory material and generates heat that changes the electrical characteristic and alters the memory state or phase of the memory material. By way of example, heating the phase-change material to a temperature above 900° C. in a write operation places the phase change material above its melting temperature (Tm). Then, a rapid cooling places the phase-change material in the amorphous state that is referred to as a reset state where stored data may have a "0" value. Taking $Ge_2Sb_2Te_5$ as an example, the time between achieving the melting temperature Tm and quenching after the local heating to achieve the amorphous phase may be less than 50 ns.

On the other hand, to program a memory cell from reset to set, the local temperature is raised higher than the crystallization temperature (Tx) for a time longer than 50 ns (for $Ge_2Sb_2Te_5$) to allow crystallization to complete. The phase-change material in the crystalline form is referred to as a set state and stored data may have a "1" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize.

In a read operation, the bit line (BL) and word line (WL) are selected and an external current is provided to the selected memory cell. To read a chalcogenide memory device, the current difference resulting from the different device resistance is sensed. It is then determined whether data stored in the selected memory cell is a "1" or "0" based on a voltage change caused by a resistance of the phase-change material of the selected memory cell. It is to be appreciated that the association of reset and set with amorphous and crystalline states, respectively, is a convention and that at least an opposite convention may be adopted.

Figure 6:
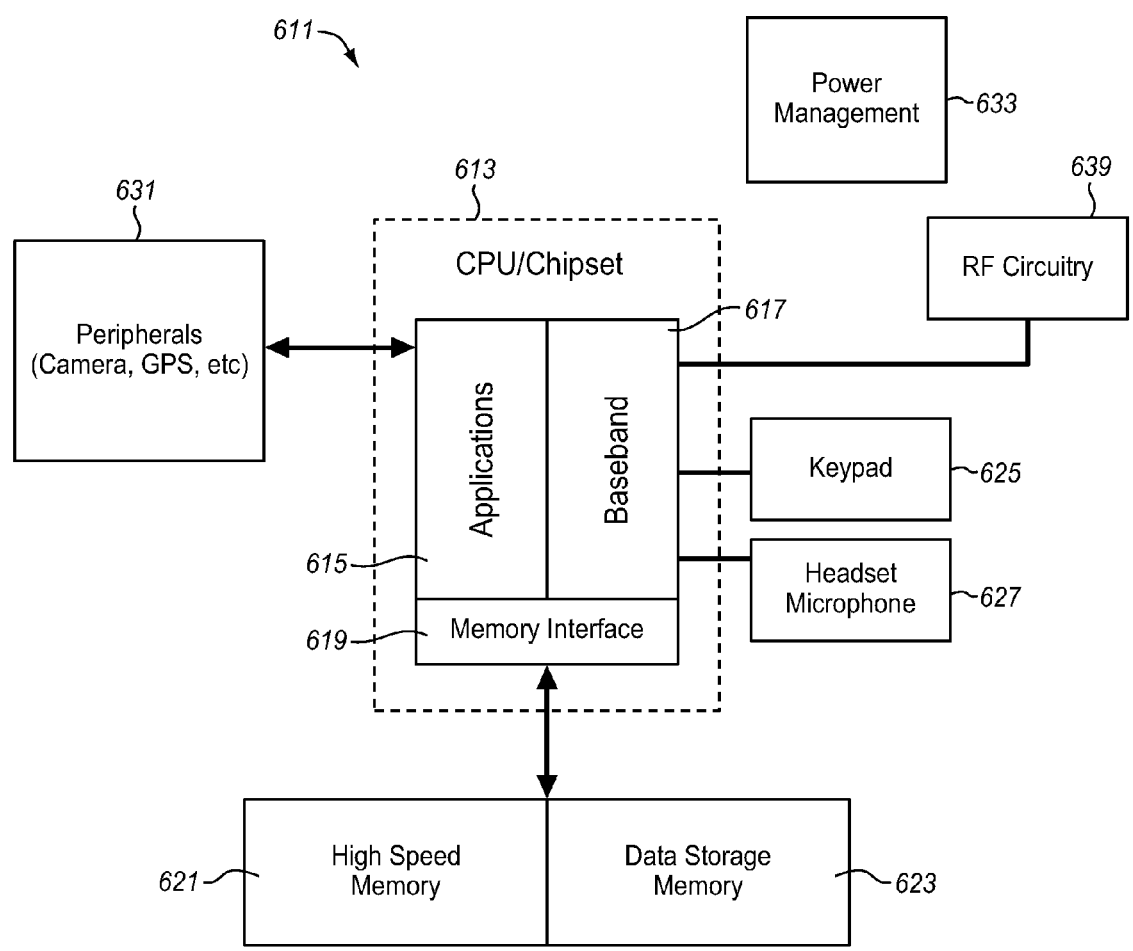
FIG. 6 is a block diagram of mobile device capable of incorporating the products of FIGS. 1 through 4 according to an embodiment.

FIG. 6 shows an example system 611 to which embodiments of the invention may be applied. In the illustrated example, the system is a mobile, handheld, cellular telephone, however, with a few modification, the system may represent a broad range of different devices. The system is driven by a central processing unit (CPU) 613 that may or may not include a chipset. The CPU has an applications section 615 that executes programs using an operating system and a baseband section 617 that handles telephony functions. Both sections are coupled to a memory interface 619 that communicates through a bus with the system's memory.

In the illustrated example, the system memory has a volatile section 621 which may be implemented as random access memory (RAM) for high speed access or PCM and a non-volatile section 623, which may be implemented as flash or PCM, for data that must survive a power loss. Typically the RAM is used as short term storage for data and instructions that must be accessed quickly, while the flash is used to store operating systems, system parameters and applications. The memory may alternatively be implemented as a single memory entirely in flash and the flash section may be implemented with other types of non-volatile memory, such as PCM (phase change memory), MRM, or FRM, or some combination of memory types. Any of the various memory configurations shown in FIGS. 1-4 may be used, depending on the particular circumstances.

The baseband section of the CPU is coupled to a user interface. In the illustrated example, the user interface has a keypad 625 and a headset 627 with a speaker and a microphone. A variety of other interfaces may be used such as a touch screen, Bluetooth devices, accelerometers, proximity sensors, and other interfaces, depending on the particular application. The baseband section is also coupled to RF (Radio Frequency) circuitry 639 to allow the system to communicate with external devices using a radio connection. The radio connection may be cellular telephone, data, wireless network, or any other interface as desired.

The CPU may also be coupled to any of a variety of peripherals 631, such as cameras, location systems, displays, printers, Bluetooth devices and other peripherals to support any additional functions of the system 611. FIG. 6 also shows a power management system 633 which may include a power supply, such as a battery to regulate the power consumption of the various components. This device may be software driven and controlled by the CPU or autonomous, or a combination of both. In one example, the power management sets a flag at a register accessible to the CPU when there is a power loss.

The term "computer readable medium" refers to suitable medium that participates in providing program instructions to a processor, a memory controller or other suitable device for execution. Such a medium may take many forms, including but not limited to, non-volatile media, and volatile media. Non-volatile media may include, for example, optical or magnetic disks, solid state storage and other memory, ROM, etc. Volatile media may include dynamic memory, such as system memory, DRAM, SRAM, and other types of volatile storage. Common forms of computer readable media include, for example, magnetic mediums (e.g., floppy disk, flexible disk, hard disk, magnetic tape, and other magnetic mediums), optical mediums (e.g., compact disc read-only memory (CD-ROM) and other optical mediums), physical medium with patterns (e.g., punch cards, paper tape, any other physical mediums), memory chips or cartridges, (e.g., RAM, programmable read-only memory (PROM), erasable programmable read-only memory (EPROM), flash memory, and other memory chips or cartridges), and any other medium from which a computer can read.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. In addition, it should be understood that operations, capabilities, and features described herein may be implemented with any combination of hardware (discrete or integrated circuits) and software.

Specific embodiments of the present invention have been described above, however, the invention is not limited to the details of such embodiments, but only by the claims below and their reasonable equivalents.

The invention claimed is:

1. A memory controller for a non-volatile memory array, the memory controller comprising:
   an external bus interface coupled to an external bus to communicate read and write instructions with an external device;
   a memory array interface coupled to the non-volatile memory array to perform reads and writes on the non-volatile memory array; and
   an overwrite module to write a desired value to a desired address of the non-volatile memory array, the overwrite module being configured to write a "1" or a "0" to a memory cell regardless of an original value of the cell.

2. The controller of claim 1, wherein the external bus interface is a flash memory interface.

3. The controller of claim 2, wherein the memory array interface is a phase change memory interface.

4. The controller of claim 1, wherein the overwrite module uses a first parameter of an address of a memory cell to be overwritten and a second parameter of a value with which to overwrite the cell.

5. The controller of claim 1, further comprising a write range module to write all cells of the memory array within an address range to a single specified value.

6. The controller of claim 1, wherein the address range for the write range module can be set to any range within the range of available addresses within the non-volatile memory range.

7. The controller of claim 1, wherein the write range module uses a first parameter of an address range of cells to be written and a second parameter of the single specified value.

8. The controller of claim 1, further comprising the non-volatile memory array coupled to the memory array interface.

9. The controller of claim 1, wherein the non-volatile memory array, the memory array interface, and the overwrite module are formed on a single die.

10. The controller of claim 1, further comprising a flash memory array interface coupled to a flash memory array to perform reads and writes on the flash memory array, the memory controller further comprising a block erase module to erase a memory block of the flash memory array.

11. A memory device comprising:
    a phase change memory (PCM) array;
    a PCM array interface coupled to the PCM array;
    an external flash memory bus interface coupled to an external flash memory bus;
    a memory controller coupled to the PCM array interface and the external flash memory bus interface to control reads and writes to the PCM array through the PCM array interface in response to commands from the external flash memory bus interface, the memory controller configured to control non-volatile memory arrays; and
    an overwrite module to write a desired value to a desired address of the non-volatile memory arrays, the overwrite module being configured to write a "1" or a "0" to a memory cell regardless of an original value of the cell.

12. The memory device of claim 11, further comprising:
    a flash memory array; and
    a flash memory array interface coupled to the memory controller,
    wherein the memory controller further controls reads and writes to the flash memory array through the flash memory array interface in response to commands from the external flash memory bus interface.

13. The memory device of claim 12, wherein the memory controller further comprises an overwrite module to write a desired value to a desired address of the PCM array and a block erase module to erase a block of cells of the flash memory array.

14. The memory device of claim 13, wherein the memory controller further comprises a write range module to write all cells of the memory array within an address range to a single specified value.

15. A method comprising:
    receiving a write command through a flash memory bus controller interface at a memory controller, the memory controller to control non-volatile memory arrays, the write command including a logical address and a bit value;

writing to a phase change memory (PCM) array through a PCM array interface and remapping the logical address to a physical address and writing the bit value to a PCM cell at the physical address; and using an overwrite module to write a desired value to a desired address of the non-volatile memory arrays, the overwrite module being configured to write a "1" or a "0" to a memory cell regardless of an original value of the cell.

16. The method of claim 15, wherein the bit value is "1" and writing the bit value comprises writing the bit value of "1" without erasing.

17. The method of claim 15, further comprising converting the received write command for application to a PCM array.

* * * * *

UNITED STATES PATENT AND TRADEMARK OFFICE
CERTIFICATE OF CORRECTION

| | | |
|---|---|---|
| PATENT NO. | : 8,250,282 B2 | Page 1 of 1 |
| APPLICATION NO. | : 12/466366 | |
| DATED | : August 21, 2012 | |
| INVENTOR(S) | : Emanuele Confalonieri et al. | |

It is certified that error appears in the above-identified patent and that said Letters Patent is hereby corrected as shown below:

In column 10, line 8, in Claim 6, delete "claim 1," and insert -- claim 5, --, therefor.

In column 10, line 13, in Claim 7, delete "claim 1," and insert -- claim 5, --, therefor.

Signed and Sealed this
Thirtieth Day of October, 2012

David J. Kappos
*Director of the United States Patent and Trademark Office*